(12) United States Patent
Vogel

(10) Patent No.: US 6,988,251 B2
(45) Date of Patent: Jan. 17, 2006

(54) EFFICIENT IMPLEMENTATION OF MULTIPLE CLOCK DOMAIN ACCESSES TO DIFFUSED MEMORIES IN STRUCTURED ASICS

(75) Inventor: Danny C. Vogel, Sudbury, MA (US)

(73) Assignee: LSI Logic Corporation, Milpitas, CA (US)

( * ) Notice: Subject to any disclaimer, the term of this patent is extended or adjusted under 35 U.S.C. 154(b) by 129 days.

(21) Appl. No.: 10/684,733

(22) Filed: Oct. 14, 2003

(65) Prior Publication Data

US 2005/0078544 A1   Apr. 14, 2005

(51) Int. Cl.
G06F 17/50   (2006.01)

(52) U.S. Cl. .................... 716/2; 716/6; 716/11; 716/17
(58) Field of Classification Search ................ 716/2, 716/5, 11, 17, 6
See application file for complete search history.

(56) References Cited

U.S. PATENT DOCUMENTS

2004/0111690 A1 *   6/2004   Reuland et al. ............... 716/17
2004/0128641 A1 *   7/2004   Broberg et al. ............... 716/18

* cited by examiner

Primary Examiner—Thuan Do
(74) Attorney, Agent, or Firm—Christopher P. Maiorana PC

(57) ABSTRACT

A semiconductor device comprising one or more diffused memories and one or more diffused regions. The one or more diffused regions may be configured to provide one or more ports for the one or more diffused memories.

21 Claims, 8 Drawing Sheets

EFFICIENT IMPLEMENTATION OF MULTIPLE CLOCK DOMAIN ACCESSES TO DIFFUSED MEMORIES IN STRUCTURED ASICS

FIELD OF THE INVENTION

The present invention relates to Very Large Scale Integrated (VLSI) circuit design technology generally and, more particularly, to an efficient implementation of multiple clock domain accesses to diffused memories in structured application specific integrated circuits (ASICs).

BACKGROUND OF THE INVENTION

Application specific integrated circuits (ASIC) allow a designer to implement exactly the intellectual property blocks (also referred to as IP or macro function blocks) and/or memories needed, in the quantities needed, for a particular design. However, a structured ASIC can provide less design flexibility because much of the IP, particularly memories, is fixed within the base slice of the structured ASIC. Utilizing the fixed memories in ways to satisfy the designer specification, when the memory type is not an exact match has been a focus of product development. Much of the development has focused on joining memories to form different sizes, or splitting a single physical dual port memory into two logical single port memories.

One memory configuration not addressed by previous solutions is a memory with a high port count, such as a 3 or 4 port memory. There is not necessarily a requirement for high bandwidth access to memory on each of the ports in many architectures, but rather each port may need to support a different clock domain (not necessarily a different clock frequency on each port). However, high port count memories tend to be less die efficient and are less desirable to implement in a structured ASIC. Also, there is less of a consensus for the requirements for high port count memories among designers, making the high port count memories less amenable to diffusion onto structured ASICs. Thus, it is economically undesirable to build structured ASICs with high port count memories, yet designers can need such memories.

One current solution for the problem is to have a designer re-architect the design requirements. However, re-architecting the problem to reduce clock domains is not always feasible. The clock domains are frequently outside the control of the chip design and the system box design. Rather, the clock domains are in the realm of the network design.

Another solution uses another memory block to implement a first-in first-out (FIFO) memory on one or more of the ports. Adding a FIFO memory to a port to reduce the clock domains presented to the main memory (or buffer memory) is the most common solution. However, the FIFO memory uses another memory block to implement, and again, memory blocks are a finite, limited resource on a structured ASIC. In addition, even if the FIFO size requirement is quite small, the memory blocks available on the structured ASIC can be much larger than necessary, and are seldom physically located nearby on the die. Thus, the use of the limited memory resource can be somewhat inefficient and can require more routing that can potentially impact performance. The primary problem is when a designer has to utilize multiple physical memories for FIFOs to implement multiport/clock domain memories, yet also needs most/all the memory blocks for other parts of the design.

It would be desirable to have an efficient implementation of multiple clock domain accesses to diffused memories in structured application specific integrated circuits (structured ASICs).

SUMMARY OF THE INVENTION

The present invention concerns a semiconductor device comprising one or more diffused memories and one or more diffused regions. The one or more diffused regions may be configured to provide one or more ports for the diffused memories.

The objects, features and advantages of the present invention include providing efficient implementation of multiple clock domain accesses to diffused memories in structured ASICs that may (i) allow high port count memories to be implemented on structured ASICs, (ii) maximize memory resources available to a designer and/or (iii) implement multiple clock domains without reducing diffused memory availability.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
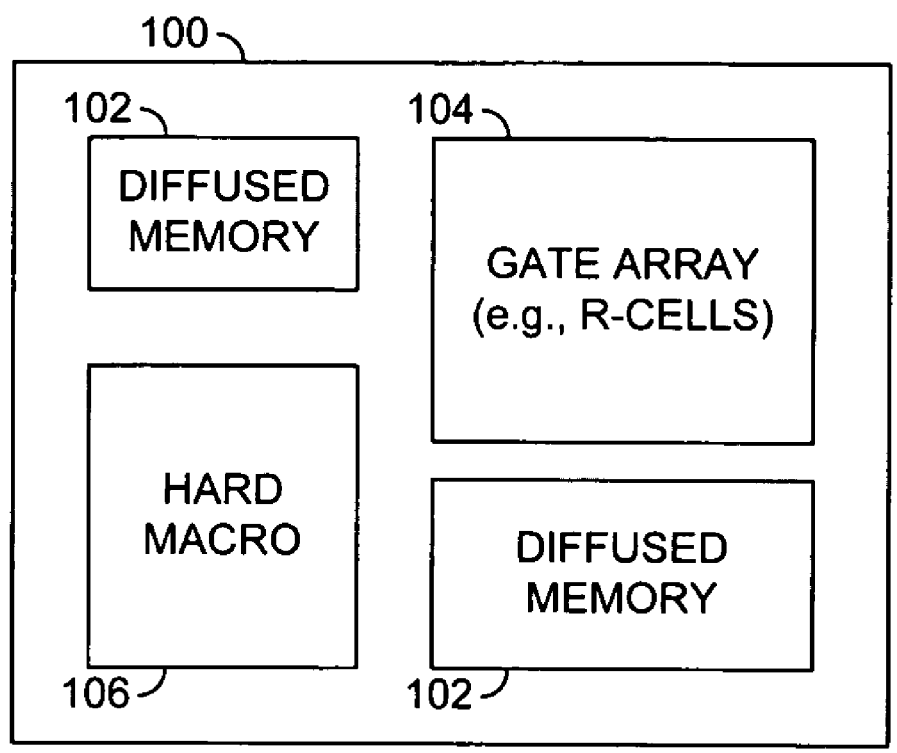
FIG. 1 is a diagram illustrating a structured application specific integrated circuit.

Referring to FIG. 1, a block diagram of a programmable platform device (or die) 100 is shown in accordance with a preferred embodiment of the present invention. The device 100 may comprise one or more regions of diffused memory 102 and one or more diffused regions 104. The regions 102 and 104 may be distributed around the die 100. The diffused regions 104 may be customized, in one example, as logic and/or memory. For example, the regions 104 may be implemented as a sea-of-gates array. In one example, the regions 104 may be implemented with a number of R-cells. As used herein, R-cells generally refer to an area of silicon designed (or diffused) to contain one or more transistors or gates that have not yet been personalized (or configured)

with metal layers. Wire layers may be added to the R-cells to make particular transistors, logic gates and/or storage elements. An R-cell generally comprises one or more diffusions for forming the parts of transistors and/or gates and the contact points where wires may be attached in subsequent manufacturing steps (e.g., to power, ground, inputs and outputs).

In general, the R-cells may be, in one example, building blocks for logic and/or storage elements. For example, one way of designing a chip that performs logic and storage functions may be to lay down numerous R-cells row after row, column after column. A large area of the chip may be devoted to nothing but R-cells. The R-cells may be personalized (or configured) in subsequent production steps (e.g., by depositing metal layers) to provide particular logic functions. The logic functions may be further wired together (e.g., a gate array design).

The device 100 may comprise one or more hard macros 106. The hard macros 106 may include diffused patterns of circuit designs that are customized and optimized for particular functions. The hard macros 106 generally act much like an ASIC design. For example, a high speed interface may be routed into the hard macro. The hard macro may be configured to perform signal processing to correctly receive the interface and correct for any errors that may be received at the interface, according to the levels of the interface protocol. In general, hard macros may be implemented to provide a number of functions on the device 100. For example, the hard macros 106 may comprise phase locked loops (PLLs), instances of processors, memories, input/output PHY level macros, etc.

Figure 2:
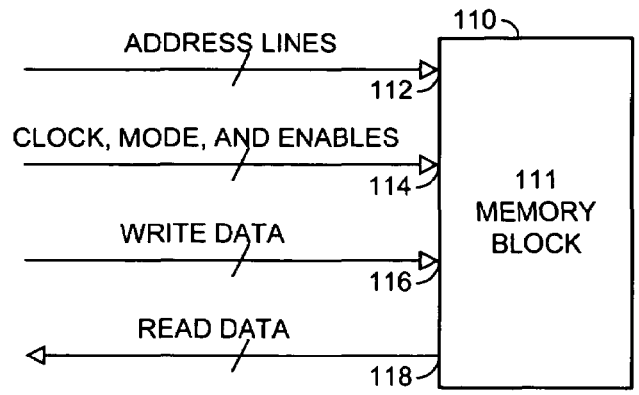
FIG. 2 is a diagram illustrating a single port, single read, single write (111) diffused memory.

Referring to FIG. 2, a block diagram of a memory block 110 is shown. The memory block 110 may be implemented as a standard single port, single read, single write memory (e.g., generally referred to as a 111 memory). In one example, the memory block 110 may be implemented as a diffused memory block in one of the regions 102. In another example, the memory block 110 may be implemented as an R-cell memory block in one of the regions 104. The memory block 110 may have an address input 112, an input 114 for receiving a number of control signals, an input 116 for receiving write data and an output 118 for presenting read data.

Figure 3:
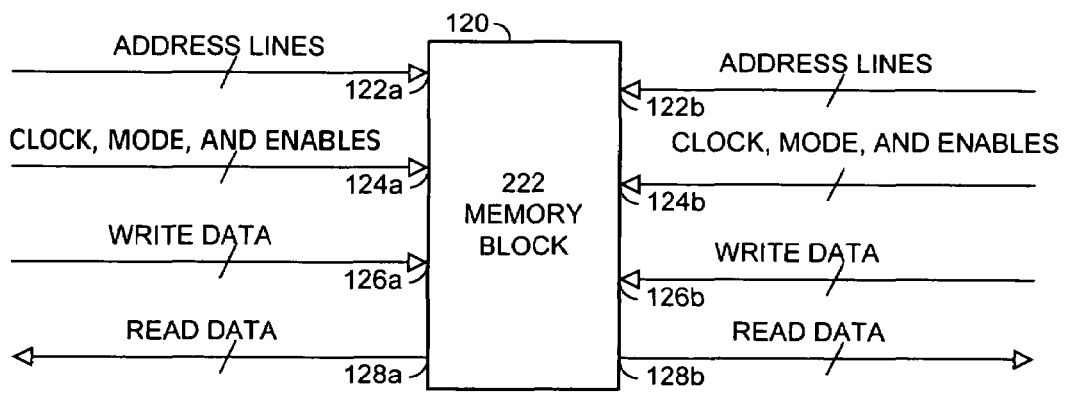
FIG. 3 is a diagram illustrating a two ports, two reads, two writes (222) diffused memory.

Referring to FIG. 3, a block diagram of a memory 120 is shown. The memory 120 may be implemented as a standard 2 ports, 2 reads, 2 writes memory (e.g., generally referred to as a 222 memory). In one example, the memory block 120 may be implemented as a diffused memory block in one of the regions 102. In another example, the memory block 120 may be implemented as an R-cell memory block in one of the regions 104. The memory 120 may have an input 122a for receiving a first address, an input 122b for receiving a second address, an input 124a for receiving a number of first control signals, an input 124b for receiving a number of second control signals, an input 126a for receiving a first set of write data, an input 126b for receiving a second set of write data and outputs 128a and 128b for presenting first and second sets of read data, respectively. The inputs and outputs 122a, 124a, 126a and 128a may represent a first port. The input 122b, 124b and 126b and output 128b may represent a second port.

Figure 4:
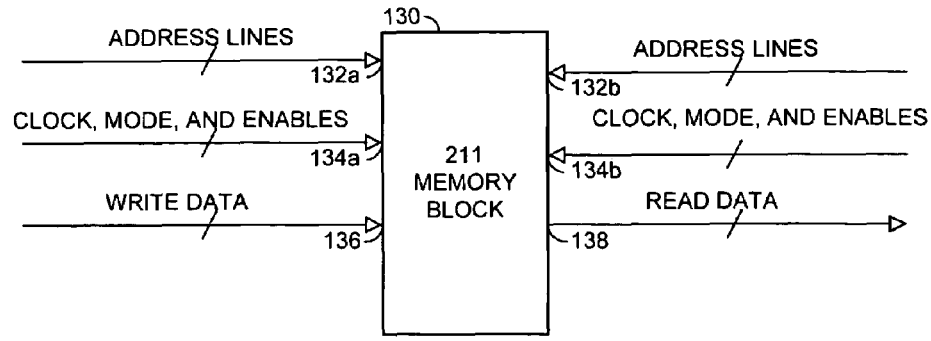
FIG. 4 is a diagram illustrating a two ports, single read, single write (211) diffused memory.

Referring to FIG. 4, a block diagram of a memory 130 is shown. The memory 130 may be implemented as a standard 2 ports, single read, single write memory (e.g., generally referred to as a 211 memory). In one example, the memory block 130 may be implemented as a diffused memory block in one of the regions 102. In another example, the memory block 130 may be implemented as an R-cell memory block in one of the regions 104. The memory 130 may have an input 132a to receive a first address, an input 132b to receive a second address, an input 134a to receive a first set of control signals, an input 134b to receive a second set of control signals, an input 136 to receive write data and an output 138 to present read data.

Figure 5:
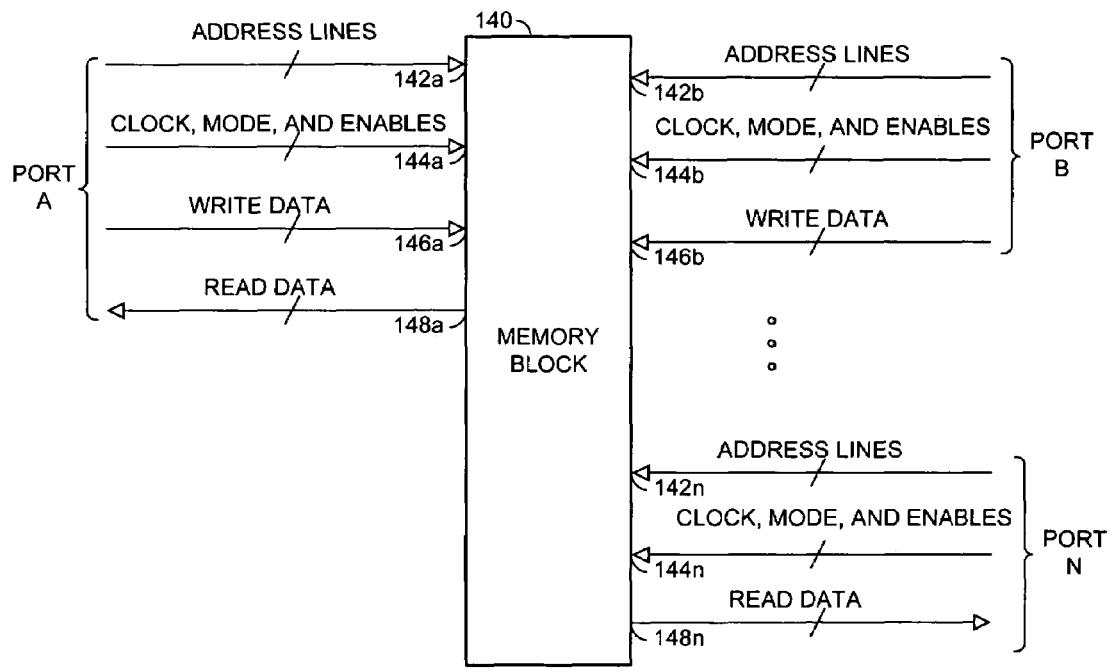
FIG. 5 is a block diagram of a high port count memory implemented in accordance with a preferred embodiment of the present invention.

Referring to FIG. 5, a block diagram of a memory 140 is shown illustrating an example memory block implemented on the circuit 100. The memory 140 may be implemented having n ports, where n is an integer greater than one. In one example, the memory 140 may be implemented as a 3 port memory, where 1 port is a read port, 1 port is a write port and a third port allows reads and writes. However, other combinations of ports may be implemented accordingly to meet the design criteria of a particular application. The memory 140 may have a number of inputs 142a–142n that may receive address signals, a number of inputs 144a–144n that may receive control signals, a number of inputs 146a–146n that may receive write data and a number of outputs 148a–148n that may present read data. The inputs and outputs may be grouped into a number of ports A–N. For example, the port A may comprise the inputs 142a, 144a, 146a and the output 148a. The port B may comprise inputs 142b and 144b and the output 146b. The port N may comprise inputs 142n, 144n and the output 148n. Each of the ports A–N may operate in the same or different clock domains.

Figure 6:
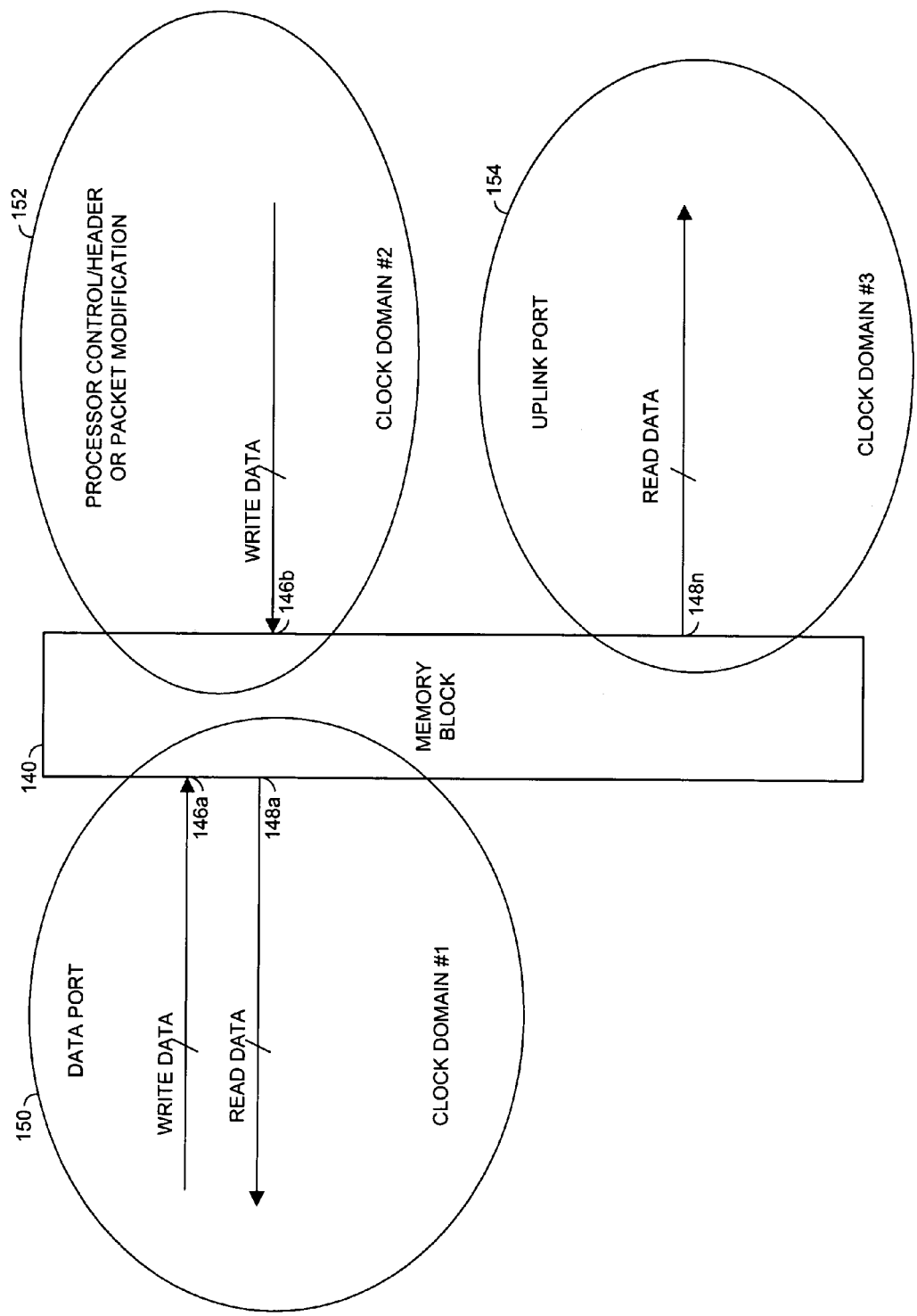
FIG. 6 is a diagram illustrating an example application of the memory of FIG. 5 with three clock domains.

Referring to FIG. 6, a block diagram illustrating an example application of the circuit 100 is shown. In one example, the port A of the memory 140 may be configured as a data port in a first clock domain 150. The port B of the memory 140 may be configured to receive processor control/header or packet modification data from a second clock domain 152. The port N of the memory 140 may be configured to operate as an uplink port in a third clock domain 154. However, other numbers of clock domains may be implemented accordingly to meet the design criteria of a particular application.

Figure 7:
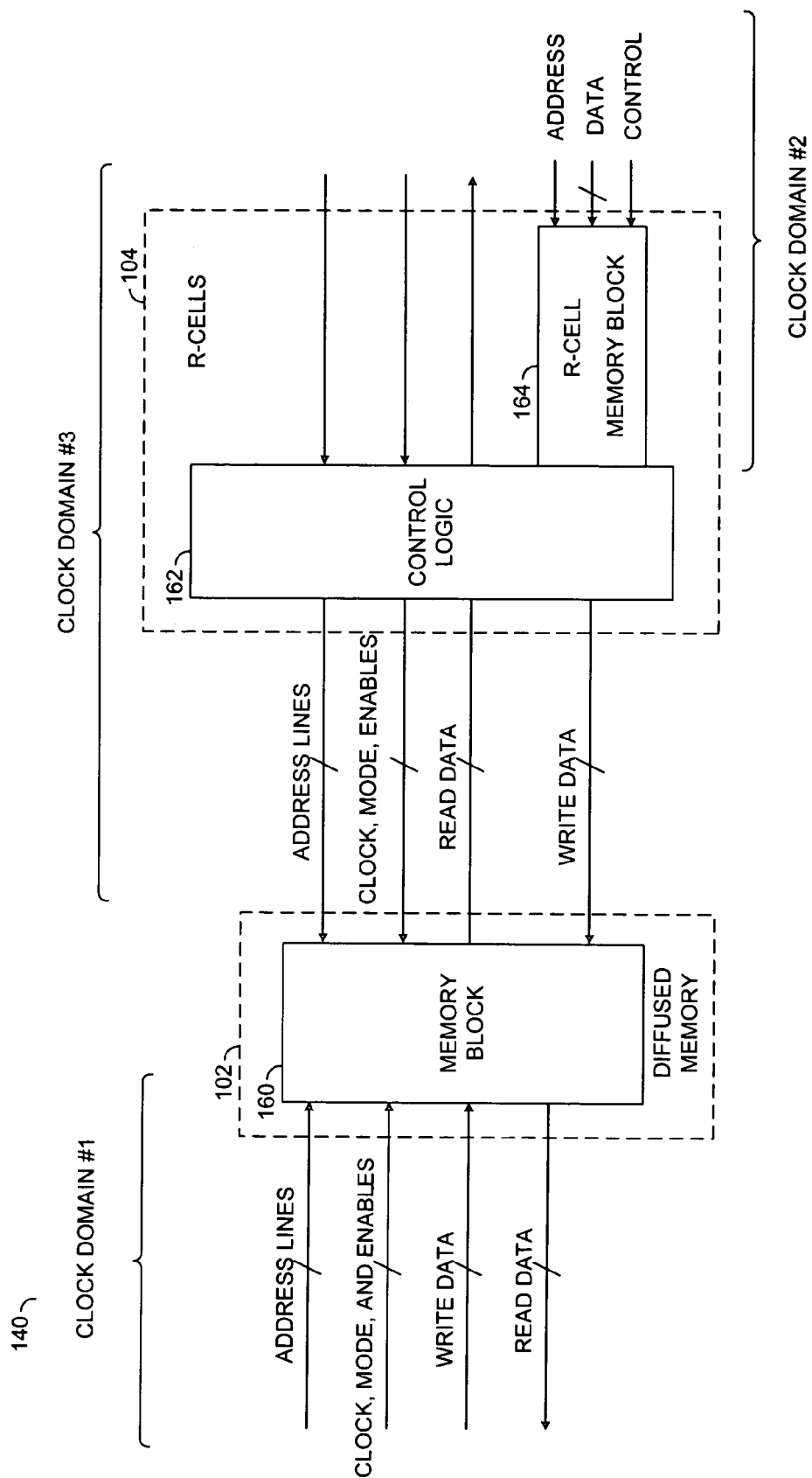
FIG. 7 is a more detailed block diagram of the high port count memory of FIG. 5.

Referring to FIG. 7, a more detailed block diagram of the memory 140 is shown illustrating a multiport implementation with three ports. The memory 140 may comprise a block (or circuit) 160, a block (or circuit) 162 and a block (or circuit) 164. The block 160 may comprise a memory block similar to the 222 memory block 120 of FIG. 3 implemented in one of the diffused memory regions 102. The block 162 may comprise a control logic block (or circuit) implemented in one of the R-cell regions 104. The block 164 may comprise, for example, a 211 memory block similar to the memory 130 of FIG. 3 implemented in the R-cell regions 104. In one example, the block 164 may be configured as a simple first-in first-out (FIFO) memory. The blocks 162 and 164 are generally implemented in the same R-cell region 104. The memory 164 may be implemented along with the logic block 162 to expand one or more ports on the diffused memory block 160 for access to and/or from multiple clock domains.

In one example, a single additional port may be implemented (e.g., to form a three port memory) by configuring the memory 164 as a single FIFO to provide access for an additional clock domain. In one example, the memory block 164 may be associated with a write port. However, the memory block 164 may, in another example, be associated with a read port or both read and write ports. In one example, a number of memories 164 may be implemented in the region 104 to provide multiple FIFOs for implementing a plurality of additional ports. In general, the memories 164 may be used to couple the memory 160 across multiple clock domains. The memories 164 may be implemented as small memories constructed from R-cells. The implementation of R-cell based FIFOs generally allows the FIFOs to be placed adjacent to the main memory (e.g., memory implemented in the diffused memory regions) and may reduce or eliminate the utilization of additional diffused memory block resources to provide multiple ports.

The present invention may be expanded to provide multiple write ports (and/or multiple read ports) coupled into a single main memory buffer by implementing more R-cell FIFOs and some arbitration logic. In general, the implementation of the R-cell memories 164 may reduce or eliminate wasting fixed (diffused) memory block resources. The depth of the R-cell memory 164 may be implemented, in one example, ranging from a single word, up to a few words in order to absorb a write burst. In general, the depth of the R-cell memories may be set to meet the design criteria of a particular application.

A multiple clock domain memory may be implemented from fixed on-chip memory resources. A multiple port memory may be implemented (with some bandwidth limitations) from the fixed on-chip memory resources. R-cell memories may be implemented to expand feature sets of the fixed memory resources. Additional memory feature availability (e.g., multiport, multi clock domain, etc.) may be implemented within fixed resources of the structured ASIC. Greater flexibility in utilization of memory resources on a structured ASIC may be realized (e.g., the present invention does not require use of additional fixed memory resources in order to cross clock domains).

Multiple (e.g., n, where n is an integer) FIFOs may be added in front of a memory port to create an "n" port memory. Each added port generally shares the actual bandwidth into the memory with the other added ports. However, each port may have an independent clock domain. The present invention may also be used to add multiple ports within the same clock domain. FIFOs may be added to read ports as well as the write ports. In general, the read ports may gain similar benefits to the write ports. However, the addition of FIFOs to the read ports may be less viable due to added latency imposed on a read of memory (generally a write can absorb some additional latency).

Figure 8:
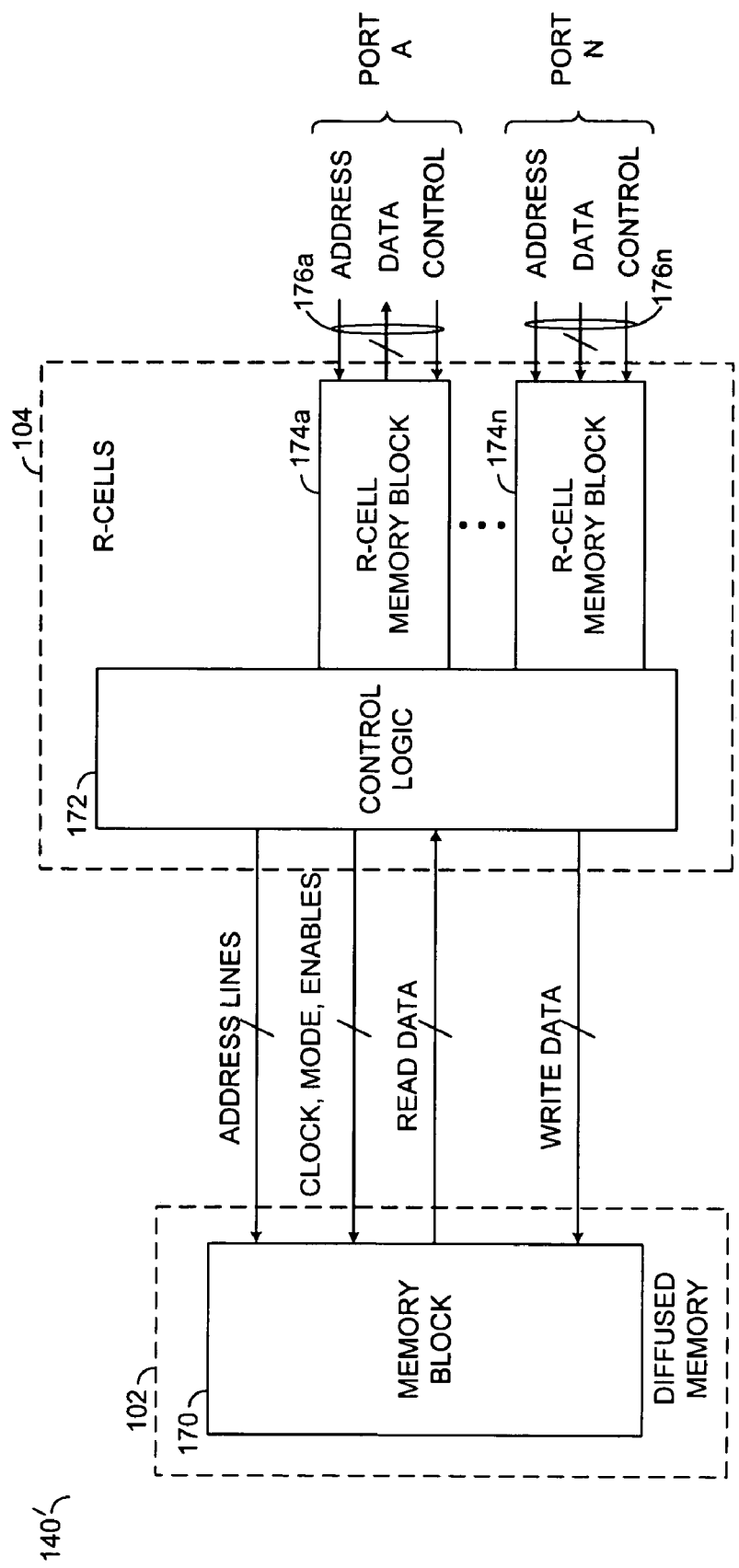
FIG. 8 is a block diagram illustrating another example high port count memory in accordance with the present invention.

Referring to FIG. 8, a block diagram of a circuit 140' is shown illustrating another example multiport implementation in accordance with the present invention. The circuit 140' may comprise (i) a memory block 170 implemented in one of the diffused regions 102 and (ii) a control logic block 172 and a number of R-cell memory blocks 174a–n implemented in the diffused regions 104. In one example, the memory block 170 may be implemented as a single port, single read, single write (111) memory. The control logic 172 and R-cell memories 174a–n may be configured to transfer read and/or write data between the memory 170 and a number of ports 176a–n. Each of the R-cell memories 174a–n may be configured, for example, as a 222 memory or a 211 memory. However, other memory configurations may be implemented accordingly to meet the design criteria of a particular application. Similarly, the memory block 170 may be implemented, for example, as a 222 memory, a 211 memory, or a 111 memory. However, other memory configurations may be implemented accordingly to meet the design criteria of a particular application.

Figure 9:
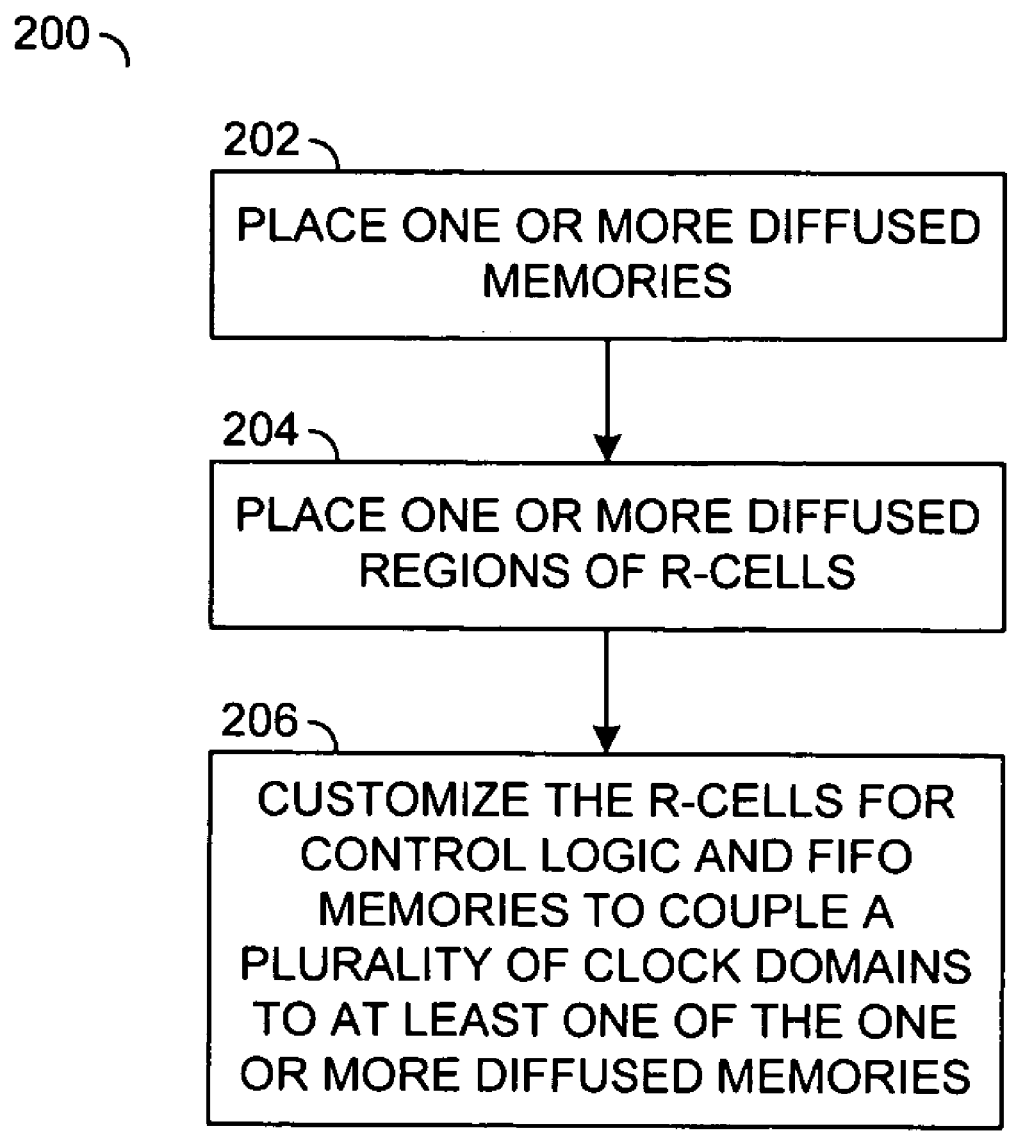
FIG. 9 is a flow diagram of a process for producing a structured ASIC in accordance with a preferred embodiment of the present invention.

Referring to FIG. 9, a flow diagram 200 is shown illustrating an example layout process in accordance with a preferred embodiment of the present invention. In one example a semiconductor layout process may begin by placing one or more regions 102 for implementing diffused memory blocks in each of a number of dies on a wafer (e.g., the block 202). Subsequent to, or simultaneously with, the placement of the diffused memory blocks, one or more regions of R-cells 104 may be placed on one or more dies of the wafer (e.g., the block 204). The regions of R-cells 104 may be associated with each of the regions of diffused memory blocks 102. When the wafer has been fabricated with the diffused memories and R-cell regions, the wafer may be set aside for a future customization based on designer specifications.

The regions of R-cells 104 may be customized to implement control logic and memory that may be employed to expand a number of ports of the diffused memory blocks 102. For example, subsequent fabrication steps may be performed on the wafer to add one or more custom metalization layers for implementing designer specified memories. In one example, when a high port count memory is to be implemented using one or more of the previously diffused memory blocks, one or more metal layers may be placed on the R-cell regions 104 in order to implement one or more FIFO memories and associated control logic (e.g., the block 206). In one example, a plurality of FIFO memories may be implemented in the R-cell regions. The plurality of FIFO memories may share a single port of the diffused memory blocks in order to provide multiple clock domain access to the diffused memory blocks.

Figure 10:
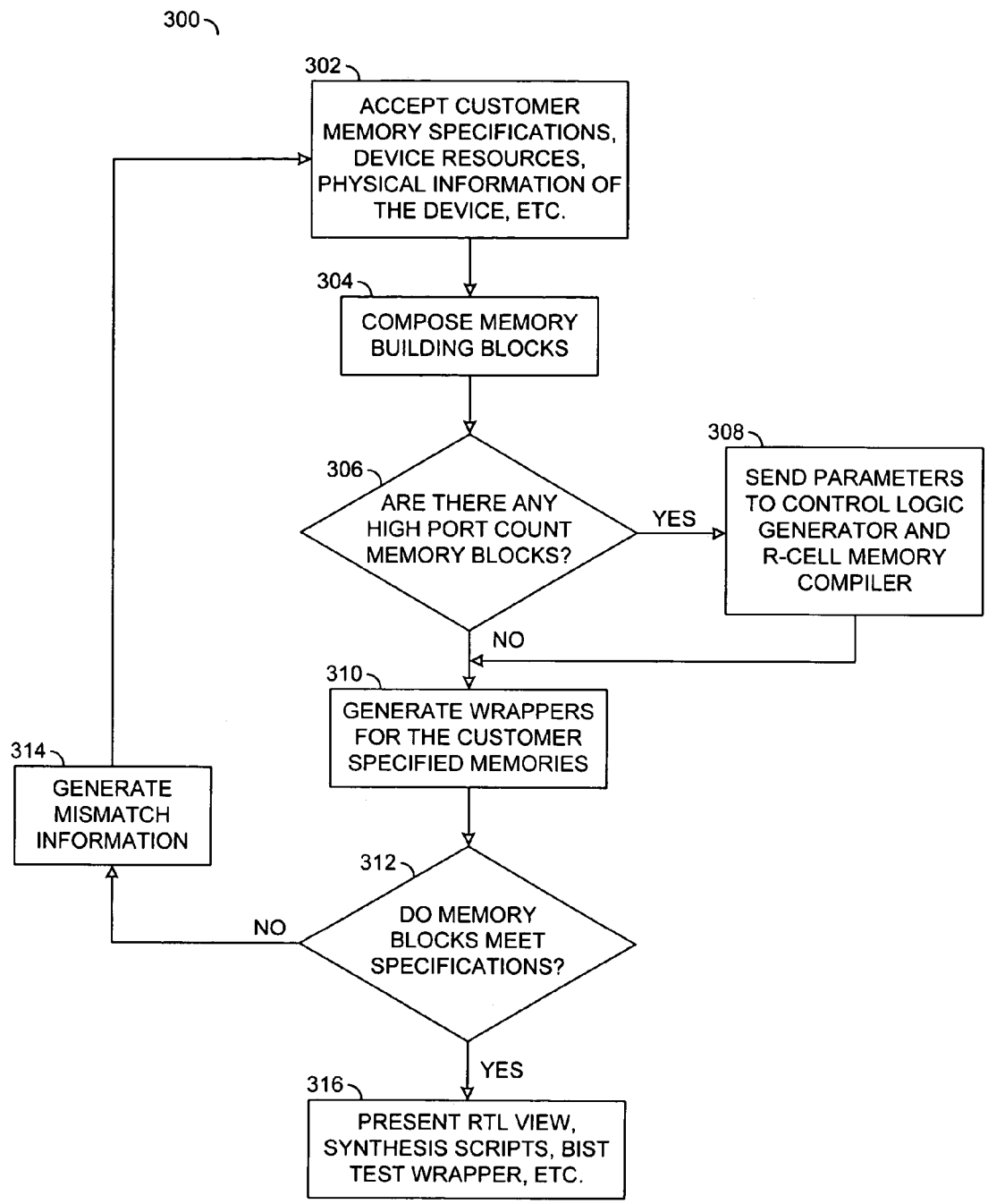
FIG. 10 is a more detailed flow diagram illustrating an example implementation of a customization step of FIG. 9.

Referring to FIG. 10, a more detailed flow diagram 300 is shown illustrating a process for customizing a structured ASIC in accordance with a preferred embodiment of the present invention. The process 300 may begin by accepting designer memory specifications, device resources, physical information of the device, etc. (e.g., the block 302). One or more memory blocks may be composed to meet the designer specification from the diffused memory on the device (e.g., the block 304). When the designer specifications call for a high port count memory (e.g., YES path from the block 306), appropriate memory blocks and control logic may be generated in the diffused R-cell region(s) of the device (e.g., the block 308). When the designer specified memories have been composed, memory wrappers and test structures may be generated (e.g., the block 310).

In one example, the generated memories may be compared to the designer specifications (e.g., the block 312). If the generated memories do not match the designer specification (e.g., NO path from the block 312), mismatch information may be generated and the process re-started (e.g., the block 314). If the generated memories meet the designer specifications (e.g., the YES path from the block 312), various views (e.g., RTL views, synthesis scripts, built-in self test wrappers, etc.) of the customized device may be generated (e.g., the block 316).

While the invention has been particularly shown and described with reference to the preferred embodiments thereof, it will be understood by those skilled in the art that various changes in form and details may be made without departing from the spirit and scope of the invention.

What is claimed is:

1. A semiconductor device comprising:
   at least one fixed memory block implemented with one or more diffused memories;
   at least one R-cell memory block implemented in one or more diffused regions; and
   control logic (i) implemented in said one or more diffused regions and (ii) configured to couple said at least one R-cell memory to said at least one fixed memory block, wherein said one or more diffused regions are configured to expand one or more ports of said at least one fixed memory block.

2. The semiconductor device according to claim 1, wherein said one or more diffused regions are customized in response to designer specifications.

3. The semiconductor device according to claim 2, wherein said diffused regions are customized by placing one or more metalization layers on said diffused regions based upon said designer specifications.

4. The semiconductor device according to claim 1, wherein said one or more diffused regions are configured couple a port of said at least one fixed memory block to a plurality of clock domains.

5. The semiconductor device according to claim 1, wherein said one or more diffused regions are configured to expand one or more ports for said one or more diffused memories.

6. The semiconductor device according to claim 1, wherein said one or more diffused regions comprise a plurality of R-cells, each R-cell comprising one or more transistors or gates that are customized by placement of one or more metal layers.

7. The semiconductor device according to claim 1, wherein said diffused regions are customized to provide one or more first-in-first-out (FIFO) memories.

8. The semiconductor device according to claim 7, wherein said diffused regions are further customized to provide control logic associated with said one or more FIFO memories.

9. The semiconductor device according to claim 7, wherein each of said one or more FIFO memories are configured as one of an input buffer and an output buffer for at least one of said one or more diffused memories.

10. The semiconductor device according to claim 1, wherein said at least one fixed memory block comprises one or more of (i) a one port, single read, single write (111) memory, (ii) a two ports, single read, single write (211) memory and (iii) a two ports, two reads, two writes (222) memory.

11. The semiconductor device according to claim 1, wherein said at least one R-cell memory block comprises one or more of (i) a two ports, single read, single write (211) memory and (ii) a two ports, two reads, two writes (222) memory.

12. The semiconductor device according to claim 1, wherein said semiconductor device comprises a structured application specific integrated circuit.

13. A semiconductor device comprising:
means for implementing at least one fixed memory block using one or more diffused memories; and
means for implementing at least one R-cell memory block and associated control logic using one or more diffused regions, wherein said at least one R-cell memory and associated control logic are configured to expand a single port of said fixed memory block into a plurality of ports.

14. A method for laying out a semiconductor device comprising the steps of:
implementing at least one fixed memory block using one or more diffused memories; and
implementing at least one R-cell memory block and associated control logic using one or more diffused regions comprising R-cells, wherein said at least one R-cell memory and associated control logic are configured to expand a single port of said fixed memory block into a plurality of ports.

15. The method according to claim 14, further comprising the step of:
customizing said one or more diffused regions comprising R-cells with one or more metal layers.

16. The method according to claim 14, further comprising the step of:
configuring said at least one R-cell memory block as one or more FIFO memories associated with one or more clock domains.

17. The method according to claim 16, further comprising the step of:
associating said one or more FIFO memories with said single port of said at least one fixed memory block.

18. The method according to claim 17, further comprising the steps of:
configuring said control logic implemented using said one or more diffused regions comprising R-cells to couple said one or more FIFO memories to said single port.

19. The method according to claim 14, wherein said one or more diffused memories comprise one or more of (i) a one port, single read, single write (111) memory, (ii) a two ports, single read, single write (211) memory and (iii) a two ports, two reads, two writes (222) memory.

20. The method according to claim 14, further comprising the step of:
customizing said one or more diffused regions comprising R-cells to implement one or more R-cell memory blocks selected from the group consisting of (i) a two ports, single read, single write (211) memory and (ii) a two ports, two reads, two writes (222) memory.

21. The method according to claim 20, further comprising the step of:
coupling at least one of said one or more diffused memories with said one or more R-cell memory blocks implemented in said one or more diffused regions comprising R-cells.

* * * * *